(12) United States Patent
Nagatani

(10) Patent No.: US 7,691,487 B2
(45) Date of Patent: *Apr. 6, 2010

(54) ELECTRODEPOSITED COPPER FOIL WITH CARRIER FOIL

(75) Inventor: Seiji Nagatani, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 771 days.

This patent is subject to a terminal disclaimer.

(21) Appl. No.: 10/488,275

(22) PCT Filed: Jun. 27, 2003

(86) PCT No.: PCT/JP03/08193

§ 371 (c)(1), (2), (4) Date: Mar. 2, 2004

(87) PCT Pub. No.: WO2004/005588

PCT Pub. Date: Jan. 15, 2004

(65) Prior Publication Data

US 2004/0241487 A1     Dec. 2, 2004

(30) Foreign Application Priority Data

Jul. 4, 2002     (JP)     ............... 2002-196128

(51) Int. Cl.
B32B 15/08     (2006.01)
H05K 1/09      (2006.01)
H05K 3/38      (2006.01)
C25D 1/20      (2006.01)

(52) U.S. Cl. ............... 428/607; 428/621; 428/626; 428/675; 428/935

(58) Field of Classification Search ............... 428/606, 428/607, 632, 674, 675, 680, 336, 446, 447, 428/448, 450, 457, 458, 901; 174/250, 256, 174/259, 258

See application file for complete search history.

(56) References Cited

U.S. PATENT DOCUMENTS 4,640,747 A * 2/1987 Ueno et al. ............... 156/151
6,329,074 B1 * 12/2001 Fujiwara et al. ............ 428/632
6,652,962 B1 * 11/2003 Sato et al. ............... 428/352
6,777,108 B1 * 8/2004 Obata et al. ............... 428/624

(Continued)

FOREIGN PATENT DOCUMENTS

EP     960725 A1     12/1999

(Continued)

Primary Examiner—John J Zimmerman
(74) Attorney, Agent, or Firm—Rothwell, Figg, Ernst & Manbeck, P.C.

(57) ABSTRACT

The present invention provides electrodeposited copper foil with a carrier foil which permits the formation of finer-pitch circuits and also enables the multilayer process to be easily performed to meet the requirements for recent printed wiring boards. According to the invention, there is provided electrodeposited copper foil with a carrier foil in which an adhesive interface layer is formed on a surface of the carrier foil and an electrodeposited copper foil layer is formed on the adhesive interface layer, which is characterized in that the electrodeposited copper foil layer is provided with a passivated layer formed without performing roughening treatment as nodular treatment and that a nickel-zinc alloy consisting essentially of 50 to 99% nickel by weight and 50 to 1% zinc by weight is adopted as the passivated layer.

10 Claims, 4 Drawing Sheets

(a) Acid pickling of carrier foil (b) Formation of adhesive interface layer (c) Formation of copper bulk layer (d) Passivation

U.S. PATENT DOCUMENTS

| | | | |
|---|---|---|---|
| 6,984,456 B2 * | 1/2006 | Okada et al. | 428/621 |
| 6,989,199 B2 * | 1/2006 | Yamamoto et al. | 428/607 |
| 2004/0038049 A1 * | 2/2004 | Suzuki et al. | 428/457 |
| 2004/0219341 A1 * | 11/2004 | Kataoka et al. | 428/209 |
| 2007/0207337 A1 * | 9/2007 | Nagatani | 428/607 |
| 2007/0237976 A1 * | 10/2007 | Okada et al. | 428/606 |

FOREIGN PATENT DOCUMENTS

| | | |
|---|---|---|
| EP | 1152070 A1 * | 11/2001 |
| JP | 2000-309898 A | 11/2000 |
| JP | 5-29740 A | 2/2003 |
| WO | WO 01/16402 A1 | 3/2001 |
| WO | WO 01/21859 A1 | 3/2001 |
| WO | WO 02/24444 * | 3/2002 |

* cited by examiner (a) Acid pickling of carrier foil (b) Formation of adhesive interface layer (c) Formation of copper bulk layer (d) Passivation

ELECTRODEPOSITED COPPER FOIL WITH CARRIER FOIL

CROSS REFERENCE TO RELATED APPLICATION

This application is a 35 USC § 371 National Phase Entry Application from PCT/JP03/008193, filed Jun. 27, 2003, and designating the U.S.

TECHNICAL FIELD

The present invention relates to electrodeposited copper foil with a carrier foil suitable for forming a fine pitch circuit.

BACKGROUND ART

Electrodeposited copper foil with a carrier foil has hitherto been used as a basic material for the manufacturing of printed wiring boards which are widely used in the field of the electrical and electronic industries. In general, electrodeposited copper foil with a carrier foil is bonded to a polymer insulating substrate, such as a glass-epoxy substrate, a phenol substrate and a polyimide, by hot pressing forming to form a copper-clad laminate, and is used in the manufacturing of printed wiring boards.

Electrodeposited copper foil with a carrier foil prevents wrinkles from occurring in the copper foil during hot press forming, thereby preventing the exudation of resin from copper foil cracks initiated by wrinkle portions and from a prepreg. Also, electrodeposited copper foil with a carrier foil is receiving attention as epoch-making copper foil which solves such problems as described above and can prevent foreign matter from mixing onto the copper foil surface until the completion of hot press forming.

In general, this electrodeposited copper foil with a carrier foil is broadly divided into the peelable type and the etchable type, and it is known that in the bonding of the electrodeposited copper foil to the carrier foil, an inorganic or organic adhesive interface layer is provided. For example, there are electrodeposited copper foil with a carrier foil having an inorganic adhesive interface layer of oxides, sulfides, etc. of Cr, Pb, Ni, etc. and electrodeposited copper foil with a carrier foil having an organic adhesive interface layer of nitrogen-containing compounds, sulfur-containing compounds, carboxylic acid, etc. (refer to the Japanese Patent Laid-Open No. 2000-309898), and there are many types of electrodeposited copper foil with a carrier foil.

Incidentally, recent years have seen increasing requirements for the downsizing of electronics and electric machinery and apparatus without showing any sign of an end to this trend, and multilayer design of printed wiring boards, which are the basic parts of electronics and electric equipment, high density design of copper foil circuits, and high density packaging design of mounted parts have been required more strongly than before. For this reason, it has been strongly required that recent copper foil provide properties which can easily realize ultrafine pitches in the etching during the manufacturing of printed wiring boards and also enables the multilayer process to be easily performed.

The hitherto used electrodeposited copper foil with a carrier foil permits the formation of fine circuits, because it can be formed into a copper-clad laminate without causing wrinkles etc. to occur in its very thin electrodeposited copper foil. However, recent printed wiring boards are strongly required to permit the formation of finer-pitch circuits. In order to form fine circuits which have further advanced in comparison with conventional one, it is thought that there is room for improvement not only in conventional electrodeposited copper foil, but also in conventional electrodeposited copper foil with a carrier foil. The present invention has been made under the circumstances as described above and has as its object the provision of electrodeposited copper foil with a carrier foil which permits the realization of fine circuits of such a level as might not be realized with conventional electrodeposited copper foil with a carrier foil and which also enables the multilayer process to be easily performed.

DISCLOSURE OF THE INVENTION

To solve the above-described problems, in the invention there is provided electrodeposited copper foil with a carrier foil in which an adhesive interface layer is formed on a surface of the carrier foil and an electrodeposited copper foil layer is formed on the adhesive interface layer, which is characterized in that the electrodeposited copper foil layer is provided with a passivated layer formed without performing roughening treatment as nodular treatment.

For copper foil used in the manufacturing of printed wiring boards, in order to ensure the adhesive strength of the copper foil with respect to a resin substrate to which the copper foil is bonded, it is general practice to obtain the anchor effect by performing roughening treatment which involves uniformly forming fine copper particles on the surface of the electrodeposited copper foil, what is called nodular roughening treatment. As shown in the schematic sectional view of a circuit of FIG. 4, this roughening treatment called nodular treatment involves uniformly forming fine copper particles 4 with a diameter of 0.1 to 3.0 μm on the surface of the electrodeposited copper foil. However, it is feared that even these fine copper particles 4 might constitute an obstacle to the formation of ultrafine circuits which are considered to be required in the future. That is, because the fine copper particles 4 are embedded in a resin substrate 5, when an ultrafine circuit 6 is formed by etching, it might be thought that the fine copper particles 4 remain within the substrate 5. As a result, it is feared that migration might occur or that in an extreme case, a short circuit might be induced. Therefore, the formation of a finer circuit can be easily formed as in the present invention, by forming an adhesive interface layer on the surface of carrier foil, forming an electrodeposited copper foil layer on the adhesive interface layer and obtaining electrodeposited copper foil with a carrier foil on which a passivated layer is formed without subjecting the electrodeposited copper foil layer to the roughening treatment as nodular treatment.

As the electrodeposited copper foil layer with a carrier foil related to the invention, it is desirable to adopt a nickel-zinc alloy as the passivated layer and it is more preferred that the nickel-zinc alloy in this case consist essentially of 50 to 99% nickel by weight and 50 to 1% zinc by weight. In recent printed wiring boards, unlike conventional glass-epoxy substrates, phenol substrates, etc., there are special substrates for which it is difficult to maintain adhesive strength, for example, substrates in which polyimide resin, BT (bismaleimide triazine) resin, thermosetting PPO (polyphenylene oxide) resin, cyanate ester resin, etc. are used. According to a study by the present inventors, it has been ascertained that in the case of these special substrates, adhesive strength can be ensured by using a nickel-zinc alloy as the passivated layer. Furthermore, the use of a nickel-alloy as the passivated layer is also suitable for what is called low dielectric substrates which contain any of a liquid crystal polymer, polyethylene fluoride, an isocyanate compound and a low dielectric polyimide compound. It is known that although these low dielectric substrates formed from these materials have an excellent dielectric constant so that they can adapt to high frequency signals, their adhesive strength is considerably low when they are bonded to general electrodeposited copper foil. However, even for these special substrates, it is possible to realize high adhesive strength when the electrodeposited copper foil with a carrier foil of the present invention is used.

It has become apparent that in the electrodeposited copper foil with a carrier foil of the present invention, the presence of the nickel in the passivated layer tends to particularly improve the adhesion to special substrates. In this passivated layer formed from a nickel-zinc alloy, the adhesion to special substrates cannot be improved very much when the nickel content is less than 50% by weight, whereas when the nickel content exceeds 99% by weight, the tendency toward occurrence of an etching residue becomes strong and this is undesirable.

According to a study by the present inventors, it has been ascertained that in the copper foil with a carrier foil related to the invention, in a case where a passivated layer of zinc and nickel is formed, the total deposited amount of nickel and zinc is preferably 20 to 100 mg/m$^2$. If this passivated layer of nickel and zinc is formed beforehand, the electrodeposited copper foil does not easily peel off from the bonded interface obtained by the bonding to a special substrate for which it is difficult to ensure adhesive strength and the passivated layer provides excellent chemical resistance, humidity resistance or solder heat resistance. If the total deposited amount is less than 20 mg/m$^2$, adhesive strength cannot be ensured. If the total deposited amount exceeds 100 mg/m$^2$, an etching residue tends to be formed during conductor circuit formation.

According to a study by the present inventors, it has been ascertained that basically, the higher the nickel content, the better adhesive strength, chemical resistance, humidity resistance and solder heat resistance will be, and that chemical resistance and solder heat resistance tend to deteriorate with increasing zinc content. And it has become apparent that when a passivated layer of nickel and zinc is formed, it is preferred from a practical standpoint that when the total deposited amount of nickel and zinc is 20 to 100 mg/m$^2$, the passivated layer contain nickel and zinc at a ratio of nickel to zinc in the range of 6:4 to 8:2. When the nickel ratio exceeds 80%, an etching residue tends to be formed during circuit formation. Also, when the zinc ratio exceeds 40%, chemical resistance and solder heat resistance deteriorate, making the copper clad impracticable.

In the passivated layer of the electrodeposited copper foil with a carrier foil of the present invention, a chromate layer is formed on a nickel-zinc alloy layer and it is desirable that a silane coupling agent-adsorbed layer in which an amino functional silane coupling agent is adsorbed on the surface of the passivated layer be formed. The chromate layer and the silane coupling agent-adsorbed layer further improve the adhesion to the insulating layer and it is possible to improve humidity resistance and chemical resistance.

This silane coupling agent is not especially limited and for example, vinyltrimethoxysilane, vinylphenyltrimethoxysilane, γ-methacryloxypropyltrimethoxysilance, γ-glycidoxypropyltrimethoxysilane, 4-glycidylbutyltrimethoxysilane, imidazole silane, triazine silane, and γ-mercaptopropyltrimethoxysilane, etc. can be enumerated. Furthermore, according to a study by the present inventors, it has been also ascertained that amino functional silanes are suitable for special substrates as this silane coupling agent. For example, γ-aminopropyltriethoxysilane, N-β-aminoethyl-γ-aminopropyltrimethoxysilane, and N-3-(4-(3-aminopropoxy)ptoxy) propyl-3-aminopropyltrimethoxysilane, etc. can be enumerated.

In the electrodeposited copper foil with a carrier foil related to the invention, it is preferred that the thickness of the electrodeposited copper foil be 0.5 to 12 μm. At present, the thickness of some types of usual electrodeposited copper foil without a carrier foil is 9 μm and 12 μm in the case of ultrathin copper foil and as mainstream copper foil has a thickness of 12 μm. However, it is difficult to manufacture such ultrathin copper foil without a carrier foil and besides it is very difficult to handle such ultrathin copper foil without a carrier foil in such a manner as not produce wrinkles. However, it becomes possible to easily handle electrodeposited copper foil with a carrier foil as in the present invention without producing wrinkles in the case of ultrathin copper foil of the thickness level of 0.5 to 12 μm and hence it becomes possible to realize the formation of ultrafine pitch circuits.

The carrier foil of the electrodeposited copper layer with a carrier foil related to the invention is not especially limited, and metal foils, such as copper foil and aluminum foil, an organic film having electrical conductivity, etc. can be used. The reason why carrier foil is required to provide electrical conductivity is that manufacturing methods of the electrodeposited copper layer with a carrier foil related to the invention require electrical conductivity. Also, there is no limit to the thickness of this carrier foil. However, in consideration of the ease of handling, the manufacturing cost, etc., it is desirable that the carrier foil be 18 to 70 μm in nominal thickness.

Furthermore, the adhesive interface layer of the electrodeposited copper layer with a carrier foil related to the invention is not especially limited. It is possible to adopt either an inorganic adhesive interface layer or an organic adhesive interface layer. In the case of an inorganic adhesive interface layer, it is possible to from the adhesive interface layer from oxides or sulfides of Cr, Pb and Ni, etc., for example.

In a case where an organic adhesive interface layer is adopted, it is desirable to adopt an organic agent as described below in order to be able to stabilize the peeling strength in the peeling of the carrier foil at a low level. It is desirable to use an organic agent constituted by one kind or two or more kinds selected from the group consisting of nitrogen-containing organic compounds, sulfur-containing organic compounds and carboxylic acid. More concretely, the nitrogen-containing organic compounds include nitrogen-containing organic compounds having a substituent and 1,2,3-benzotriazole (hereinafter referred to as "BTA"), carboxybenzotriazole (hereinafter referred to as "CBTA"), N',N'-bis (benzotriazolylmethyl) urea ("BTD-U"), 1H-1,2,4-triazole ("TA") and 3-amino-1H-1,2,4-triazole ("ATA"), etc. can be enumerated. As sulfur-containing organic compounds, mercaptobenzothiazole ("MBT"), thiocyanuric acid ("TCA"), 2-benzimidazolethiol ("BIT"), etc. can be enumerated. It is desirable to use monocarboxylic acid, in particular, as carboxylic acid, and oleic acid, linolic acid, linolenic acid, etc. can be enumerated.

Incidentally, in forming the adhesive interface layer using these organic agents, it is possible to adopt a method which involves immersing the carrier foil in a solution containing an organic agent, a method which involves showering or dropping a solution containing an organic agent onto a surface of the carrier foil, a method which involves electrodepositing an organic agent on the carrier foil, etc.

After the formation of this adhesive interface layer, the formation of the electrodeposited copper foil is performed by the electrolysis process. For this electrodeposited copper foil layer, it is possible to use an electrolyte capable of being used as a copper ion supply source, such as a copper sulfate-base solution and a copper pyrophosphate-base solution, and electrolytes are not especially limited. For example, the conditions in the case of a copper sulfate-base solution are a copper concentration of 30 to 100 g/L, a sulfuric acid concentration of 50 to 200 g/L, a solution temperature of 30 to 80° C. and a current density of 1 to 100 A/dm$^2$, and in the case of a copper pyrophosphate-base solution, the conditions are a copper concentration of 10 to 50 g/L, a potassium pyrophosphate concentration of 100 to 700 g/L, a solution temperature of 30 to 60° C., pH 8 to 12 and a current density of 1 to 5 A/dm$^2$. When the formation of this electrodeposited copper layer is finished, the above-described passivated film is formed on the surface of the electrodeposited copper layer, whereby the electrodeposited copper foil with a carrier foil of the present invention is manufactured.

BEST MODE FOR CARRYING OUT THE INVENTION

Preferred embodiments of the present invention will be described below.

First Embodiment

Figure 1:
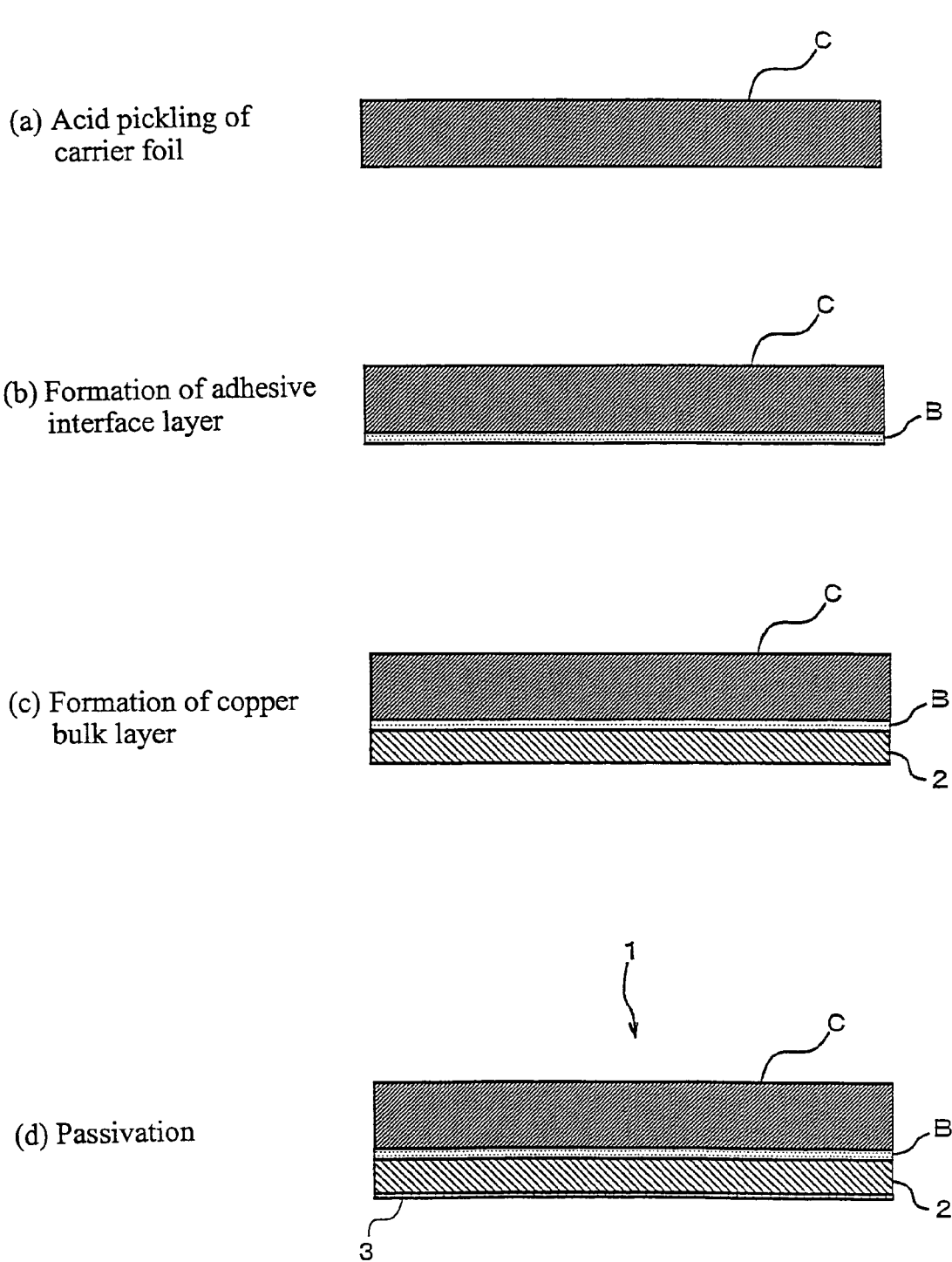
FIG. 1 is a schematic diagram showing the flow of a manufacturing method of the electrodeposited copper foil with a carrier foil related to this embodiment.

In this embodiment, electrodeposited copper foil 1 with a carrier foil related to the invention was fabricated by following the procedure shown in FIG. 1. First, in the step shown in (a) of FIG. 1, 18 μm thick copper foil was used as carrier foil C and the surface of the carrier foil C was acid pickled, whereby adhering oil and fat components were completely removed and an excessive surface oxide film was removed. This acid pickling was performed in a dilute sulfuric acid solution having a concentration of 100 g/L and a solution temperature of 30° C. for an immersion time of 30 seconds.

The carrier foil C for which acid pickling had been completed was immersed for 30 seconds in an aqueous solution of pH 5, which contains CBTA in a concentration of 5 g/L, at a solution temperature of 40° C. and an adhesive interface layer B was formed on the surface as shown in (b) of FIG. 1. Strictly speaking, when such an immersion process as described above is adopted, the adhesive interface layer B is formed on both sides of the carrier foil C. In the drawing, however, the adhesive interface layer B is shown in such a manner that it was formed only on one side of the carrier foil C.

After the completion of the formation of the adhesive interface layer B, the carrier foil C itself on which the adhesive interface layer B had been formed was cathodically polarized in a copper electrolyte and, as shown in (c) of FIG. 1, an ultrathin electrodeposited copper layer 2 (a copper layer for forming a conductor circuit having a nominal thickness of 0.5 to 12 μm) was electrolytically deposited on the adhesive interface layer B. This electrolysis was performed at a current density of 5 A/dm$^2$ by use of a sulfuric acid solution with a copper concentration of 55 g/L and a free sulfuric acid concentration of 70 g/L and at a solution temperature of 40° C. as the electrolyte at this time.

On the electrodeposited copper layer 2 was formed a passivated layer 3 without forming fine copper particles (without performing the roughening treatment as nodular treatment). In the formation of the passivated layer 3, the surface of the electrodeposited copper foil 2 was subjected to nickel-zinc alloy plating treatment, chromate treatment and silane coupling agent treatment in this order. After the silane coupling agent treatment, the electrodeposited copper foil with a carrier foil 1 related to this embodiment was fabricated by performing drying treatment. The treatment conditions are as shown in Table 1 below.

TABLE 1

| Pretreatment | Acid pickling | Concentration of sulfuric acid | 100 g/L |
|---|---|---|---|
| Nickel-zinc alloy plating | | Pyrophosphoric acid bath | |
| | | Composition  Ni | 0.3 to 1.0 g/L |
| | | Zn | 1.0 to 5.0 g/L |
| | | Solution temperature | 40° C. |
| Electrolytic chromate treatment | | Chromic acid | 1.0 g/L |
| Silane coupling agent treatment | | γ-aminopropyl-trimethoxysilane | 1.0 g/L |

Under the above-described treatment conditions, three types of electrodeposited copper foil with a carrier foil having an electrodeposited copper foil thickness of 5 μm and having different Zn and Ni coating weights (Embodiments 1 to 3 shown in Table 2) were fabricated and the adhesion to polyimide substrates was evaluated. In this evaluation of adhesion, a laminated film in which a 40 μm thick polyimide layer was formed by applying a polyimide varnish of High-Tg type (made by New Japan Chemical Co., Ltd.) to the surface side of the electrodeposited copper foil of the electrodeposited copper foil with a carrier foil and heating the polyimide varnish. And the electrodeposited layer was exposed by peeling the carrier foil and the surface was subjected to copper plating treatment with a heavy copper coating weight by electrolysis so that the total copper thickness became 18 μm. Circuits each 0.8 mm in width and 0.2 mm in width were formed from a laminated film thus formed and peel strength was measured. The results of the measurement are shown in Table 2.

TABLE 2

| | Electrodeposited copper foil Surface | | | | Peel strength (kN/m) | | |
|---|---|---|---|---|---|---|---|
| | | | | | 0.8 | 0.2 | 0.2 |
| | Roughness Rz | Ni | Zn | Cr | Normal state | Normal state | After baking |
| Embodiment 1 | 1.1 | 23 | 39 | 3.2 | 0.48 | 0.28 | 0.73 |
| Embodiment 2 | 1.2 | 26 | 11 | 2.6 | 0.55 | 0.44 | 0.75 |
| Embodiment 3 | 1.0 | 28 | 4.0 | 2.9 | 0.57 | 0.47 | 1.43 |

(Unit of amount of Ni, Zn and Cr: mg/m$^2$)

The peel strength shown in Table 2 will be described. In Table 2, "0.8 Normal state" and "0.2 Normal state" mean that a 0.8 or 0.2 mm wide circuit was formed and the peeling strength (kN/m) of the circuit as it is was measured at room temperature without performing treatment. In Table 2, "0.2 After baking" means that a 0.2 mm wide circuit was formed and its peel strength was measured after performing baking in an oven at 150° C. for 50 minutes. As is apparent from Table 2, it became apparent that peel strength of about 0.5 kN/m with respect to a polyimide resin of poor adhesion could be realized even without nodular treatment. Also, it was ascertained that the higher the nickel ratio in a nickel-zinc alloy, the better peel strength and hydrochloric acid resistance would be.

Next, results of an investigation of circuit formation characteristics will be described. This investigation of circuit formation characteristics was performed by fabricating a printed wiring board. First, a laminate was formed by use of a polyimide film (thickness: 60 µm) and electrodeposited copper foil with a carrier foil having an extrathin copper layer with a thickness of 1 µm (copper foil with 35 µm thick carrier foil). After the removal of the carrier foil, a reside on the adhesive interface layer was removed by performing acid pickling, the surface of the electrodeposited copper foil which was exposed was coated with a resist, and a pattern for circuit formation was formed on the resist by use of an exposure film having a pattern 30 µm in width and a space of 50 µm. With this pattern for circuit formation left, pattern plating was performed in such a manner that the total copper thickness including the ultrathin copper foil of 1 µm became about 20 µm. For the pattern plating conditions, a copper sulfate plating solution with a copper sulfate concentration of 150 g/L and a sulfuric acid concentration of 70 g/L was used, the solution temperature was 30° C., the current density was 5 A/dm$^2$ and the plating treatment time was 20 minutes. 25' After this pattern plating treatment, the resist was peeled and flash etching was performed, whereby the ultrathin copper foil of 1 µm protected with the 30 µm wide resist was removed. For the flash etching conditions, a commercially available sulfuric acid-hydrogen peroxide-base etching solution was used and the etching time was 5 seconds. A circuit with a circuit width of 50 µm and a space of 30 µm was formed in the above-described manner. The section of the circuit of this sample was observed under an optical microscope (400× magnification) and the state of circuit formation was observed under a scanning electron microscope (500× magnification). The photograph of the section and a SEM observation image are shown in FIGS. 2 and 3, respectively.

Figure 2:
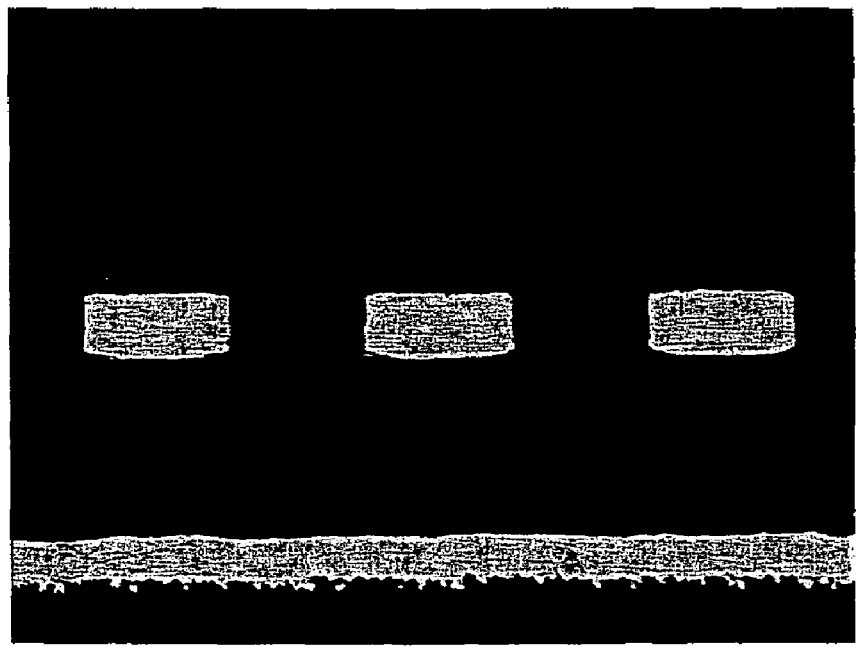
FIG. 2 is an optical microscope photograph of an observed section of a formed circuit.
Figure 3:
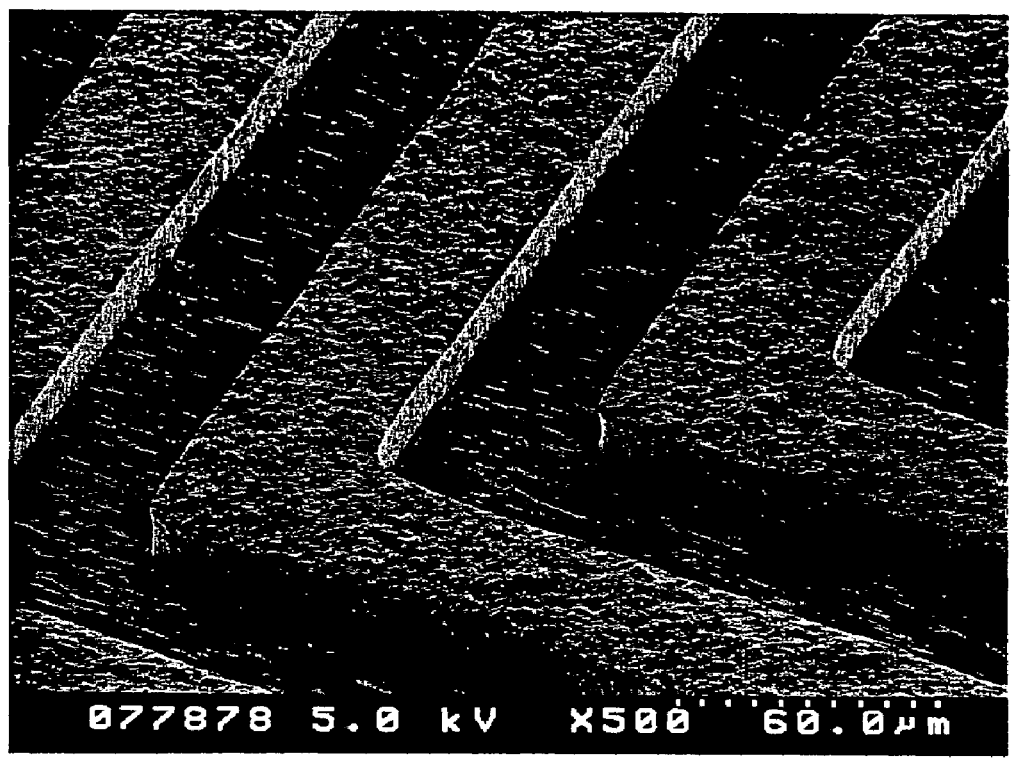
FIG. 3 is a scanning electron microscope photograph of an observed section of a formed circuit.
Figure 4:
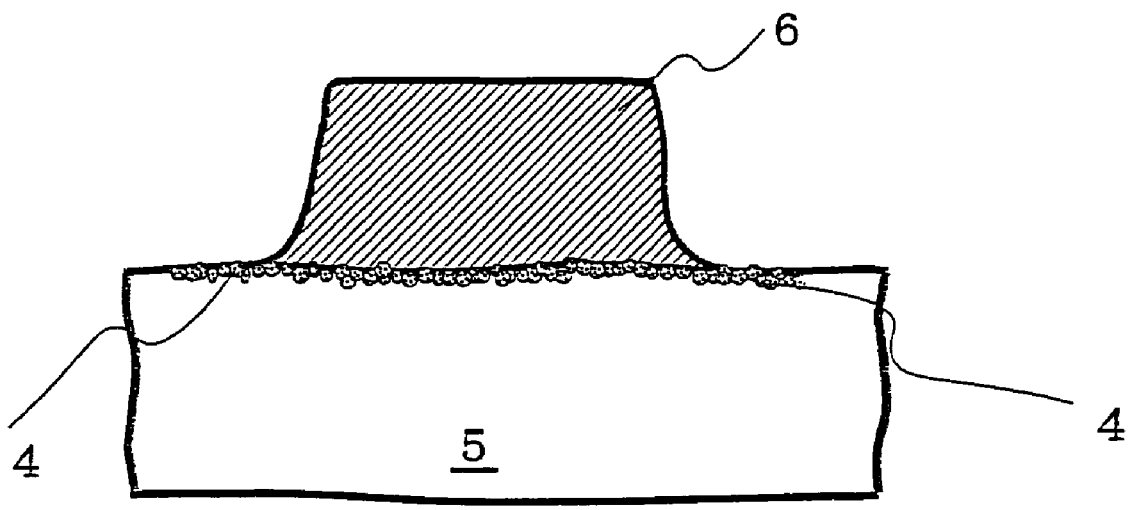
FIG. 4 is a schematic sectional view of a circuit formed from electrodeposited copper foil which is subjected to nodular treatment.

As is apparent from FIGS. 2 and 3, it became evident that by using the electrodeposited copper foil with a carrier foil of this embodiment, it is possible to form an ideal circuit which is excellent in linearity and has a high etching factor. Also, as is apparent from the substrate surface exposed between circuits, it was ascertained that the substrate surface is very smooth. From this, it is concluded that when a very fine circuit, in particular, a circuit with a very narrow gap from adjacent circuits is formed by using the electrodeposited copper foil with a carrier foil of this embodiment, it is possible to avoid instability factors such as a short between circuits and migration between circuits which were considered possible in conventional electrodeposited copper foil or electrodeposited copper foil with a carrier foil.

Second Embodiment

Next, for the passivation of the bonded surface of electrodeposited copper foil with a carrier foil, a description will be given of results of an investigation of adhesive properties when the coating weight of zinc and nickel and their composition ratio are varied.

The electrodeposited copper foil with a carrier foil used in this second embodiment was obtained by a manufacturing method similar to that adopted in the first embodiment, and by controlling the nickel and zinc concentrations, current density, etc., during the nickel-zinc alloy plating treatment, passivated layers having different coating weights and composition ratios of nickel and zinc were obtained. The chromate treatment and the silane coupling agent treatment were the same as with the first embodiment.

Electrodeposited copper foil with carrier foil in which the coating weights and component ratios of nickel and zinc in the nickel-zinc alloy plating treatment as shown in Table 3 was produced and as with the first embodiment, a laminated film in which a 40 µm thick polyimide layer was formed by applying a polyimide varnish of High-Tg type (made by New Japan Chemical Co., Ltd.) to the surface side of the electrodeposited copper foil of the electrodeposited copper foil with a carrier foil and heating the polyimide varnish. And the electrodeposited layer was exposed by peeling the carrier foil and the surface was subjected to copper plating treatment with a heavy copper coating weight by electrolysis so that the total copper thickness became 18 µm. Circuits each 0.8 mm in width were formed and peel strength in a normal state was measured. Furthermore, as an investigation of chemical resistance properties, samples in which a 0.8 mm wide circuit is formed were immersed in a hydrochloric acid solution (concentration: 12%, room temperature), peel strength was measured after drying, and chemical resistance was investigated by calculating to what percent peeling strength deteriorates from that in a normal state. In addition, solder heat resistance after PCT was investigated. This PCT stands for the pressure cooker test. The measurement of the solder heat resistance after PCT was performed by forming a 5 cm square sample for each laminated film, allowing the sample to stand for 2 hours in an atmosphere of 100% RH at 121° C. under 2 atmospheric pressures, followed by drying it, and then floating the sample in the solder bath at 246° C. for 20 seconds, which was visually observed for adhesion between the electrodeposited copper foil and the film. Moreover, an etching residue of the film surface was also investigated by performing an analysis of the film surface after the circuit formation by use of an EPMA analyzer (JXA-8100 made by JEOL, Ltd.)

TABLE 3

| | Electrodeposited copper foil Surface | | | | Peel strength (kN/m) | | | |
| --- | --- | --- | --- | --- | --- | --- | --- | --- |
| | | | | | 0.8 | Chemical | Solder heat | |
| | Roughness Rz | Ni | Zn | Cr | Normal state | resistance (%) | resistance after PCT | Etching residue |
| Embodiment 4 | 1.0 | 95.3 | 22.2 | 3.2 | 0.61 | 10.0 | Normal | Poor |
| Embodiment 5 | 1.2 | 10 | 4 | 2.6 | 0.35 | 48.5 | Occurrence of delamination | Good |

TABLE 3-continued

| | Electrodeposited copper foil Surface | | | | Peel strength (kN/m) | | Solder heat resistance after PCT | Etching residue |
|---|---|---|---|---|---|---|---|---|
| | Roughness Rz | Ni | Zn | Cr | 0.8 Normal state | Chemical resistance (%) | | |
| Embodiment 6 | 1.1 | 80.5 | 19.3 | 2.7 | 0.59 | 15.1 | Normal | Good |
| Embodiment 7 | 1.2 | 59.6 | 41.0 | 2.4 | 0.54 | 16.7 | Normal | Good |
| Embodiment 8 | 1.2 | 89.1 | 11.5 | 2.8 | 0.63 | 8.9 | Normal | Poor |
| Embodiment 9 | 1.3 | 40.5 | 58.3 | 3.0 | 0.46 | 35.9 | Occurrence of delamination | Good |

(Unit of amount of Ni, Zn and Cr: $mg/m^2$)

As shown in Table 3, although peel strength and chemical resistance are excellent when the nickel coating weight is heavy, there was a tendency for an etching residue (a nickel or copper component) to be formed on the film surface after the circuit formation. Furthermore, it became apparent that when the total coating weight is too light (Embodiment 5) and when the zinc coating weight is heavier than the nickel coating weight (Embodiment 9), the phenomenon of peeling (delamination) of the film from the electrodeposited copper foil tends to occur in the solder heat resistance test after PCT.

INDUSTRIAL APPLICABILITY

As described above, according to the present invention, it becomes possible to easily form fine circuits of such a level as might not be realized with conventional electrodeposited copper foil or electrodeposited copper foil with a carrier foil and to ensure positive bonding to low-adhesion substrates etc. Because ultrathin electrodeposited copper foil can be used, it becomes possible to easily perform the multilayer process.

The invention claimed is:

1. A copper-clad laminate, comprising a carrier foil, an adhesive interface layer formed on a surface of the carrier foil, and an electrodeposited copper foil layer formed on the adhesive interface layer without roughening nodules formed on the electrodeposited copper foil layer, wherein the electrodeposited copper foil layer is provided with a passivated layer formed thereon, wherein the passivated layer is formed from a nickel-zinc alloy consisting essentially of from 50 to 99% nickel by weight and from 50 to 1% zinc by weight.

2. A printed wiring board, comprising a carrier foil, an adhesive interface layer formed on a surface of the carrier foil, and an electrodeposited copper foil layer formed on the adhesive interface layer without roughening nodules formed on the electrodeposited copper foil layer, wherein the electrodeposited copper foil layer is provided with a passivated layer formed thereon, wherein the passivated layer is formed from a nickel-zinc alloy consisting essentially of from 50 to 99% nickel by weight and from 50 to 1% zinc by weight.

3. Electrodeposited copper foil with a carrier foil associated therewith, made from a process consisting essentially of:
   forming a carrier foil;
   forming an adhesive interface layer on a surface of the carrier foil;
   forming an electrodeposited copper foil layer on the adhesive interface layer without forming roughening nodules on the electrodeposited copper foil layer; and
   forming a passivated layer from a nickel-zinc alloy consisting essentially of from 50 to 99% nickel by weight and from 50 to 1% zinc by weight on the electrodeposited copper foil layer.

4. The foil according to claim 3, wherein the passivated layer comprises a silane coupling agent-adsorbed layer formed above a chromate layer, and the chromate layer is formed above the nickel-zinc alloy layer.

5. The foil according to claim 4, wherein the silane coupling agent is an amino functional silane.

6. The foil according to claim 5, wherein the electrodeposited copper foil is from 0.5 to 12 μm thick.

7. The foil according to claim 3, wherein the passivated layer comprises a silane coupling agent-adsorbed layer formed above a chromate layer, and the chromate layer is formed above the nickel-zinc alloy layer.

8. The foil according to claim 7, wherein the silane coupling agent is an amino functional silane.

9. The foil according to claim 8, wherein the electrodeposited copper foil is from 0.5 to 12 μm thick.

10. The foil according to claim 3, wherein the total amount of nickel and zinc is between about 20 $mg/m^2$ and about 100 $mg/m^2$.

* * * * *